(12) United States Patent
Dekker et al.

(10) Patent No.: US 8,991,265 B2
(45) Date of Patent: Mar. 31, 2015

(54) PRESSURE SENSOR, SENSOR PROBE COMPRISING A PRESSURE SENSOR, MEDICAL APPARATUS COMPRISING A SENSOR PROBE AND A METHOD OF FABRICATING A SENSOR PROBE

(75) Inventors: Ronald Dekker, Eindhoven (NL); Frederik Van Der Graaf, Zuidland (NL); Johannes Fransiscus Maria Velthuis, Leiden (NL); Jacob Roger Haartsen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1028 days.

(21) Appl. No.: 12/674,439

(22) PCT Filed: Aug. 19, 2008

(86) PCT No.: PCT/IB2008/053318
§ 371 (c)(1),
(2), (4) Date: Jan. 6, 2011

(87) PCT Pub. No.: WO2009/027897
PCT Pub. Date: Mar. 5, 2009

(65) Prior Publication Data
US 2011/0094314 A1    Apr. 28, 2011

(30) Foreign Application Priority Data
Aug. 27, 2007 (EP) .................................... 07115051

(51) Int. Cl.
*G01L 7/00* (2006.01)
*G01L 19/14* (2006.01)
*G01L 9/00* (2006.01)

(52) U.S. Cl.
CPC ............. *G01L 19/148* (2013.01); *G01L 9/0042* (2013.01)
USPC ... 73/862.045; 73/1.15; 73/1.35; 73/862.627; 73/762

(58) Field of Classification Search
CPC . G01L 5/161; G01L 1/18; H01L 2924/00014; H01L 2224/48091; G05D 7/0635; B81B 2201/0264; B01L 2200/027; B01L 2300/0887; B01L 2400/0481; F16K 99/0015; G06F 3/04815; G06F 3/04817; G06F 3/017; G06F 3/0481; C12N 15/8261
USPC ............. 73/762, 1.15, 1.35, 862.627, 862.045
See application file for complete search history.

(56) References Cited

U.S. PATENT DOCUMENTS

| | | | |
|---|---|---|---|
| 5,983,727 A * | 11/1999 | Wellman et al. | ................. 73/724 |
| 6,221,023 B1 | 4/2001 | Matsuba et al. | |
| 6,694,829 B2 * | 2/2004 | Chimura et al. | ......... 73/862.627 |
| 6,762,510 B2 * | 7/2004 | Fock et al. | .................... 257/787 |
| 6,858,451 B2 | 2/2005 | Suzuki | |

(Continued)

FOREIGN PATENT DOCUMENTS

| | | |
|---|---|---|
| DE | 102005043689 A1 | 3/2007 |
| EP | 0321097 A2 * | 6/1989 |

(Continued)

*Primary Examiner* — Peter Macchiarolo
*Assistant Examiner* — Mohammed Keramet-Amircola

(57) ABSTRACT

A pressure sensor includes a flexible membrane deformable in response to pressure. The flexible membrane covers a cavity and includes a strain gauge that produces signals corresponding to deformation of the flexible membrane. The flexible membrane is a flexible monolithic integrated circuit foil.

9 Claims, 7 Drawing Sheets

(56) References Cited

U.S. PATENT DOCUMENTS

| | | |
|---|---|---|
| 7,207,227 B2 | 4/2007 | Rangsten et al. |
| 8,068,910 B2 * | 11/2011 | Gerber et al. .................. 607/41 |
| 2002/0139203 A1 * | 10/2002 | Chimura et al. ......... 73/862.627 |
| 2004/0118213 A1 | 6/2004 | Ou |
| 2007/0026560 A1 | 2/2007 | Sato |
| 2007/0185397 A1 * | 8/2007 | Govari et al. ................ 600/424 |

FOREIGN PATENT DOCUMENTS

| | | | |
|---|---|---|---|
| EP | 0530434 A1 | 3/1993 | |
| GB | 2148008 A | 5/1985 | |
| JP | 61245035 A | 10/1986 | |
| JP | 2000193546 A | 7/2000 | |
| JP | 2000306188 A | 11/2000 | |
| JP | 2004113846 A1 * | 4/2004 | ............... B08B 3/12 |
| JP | 2007033304 A | 2/2007 | |

* cited by examiner

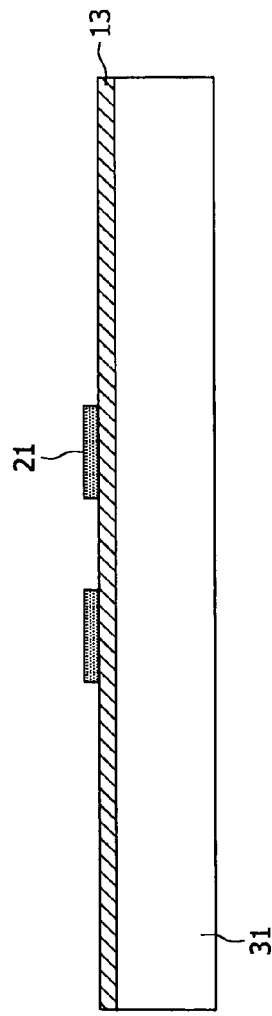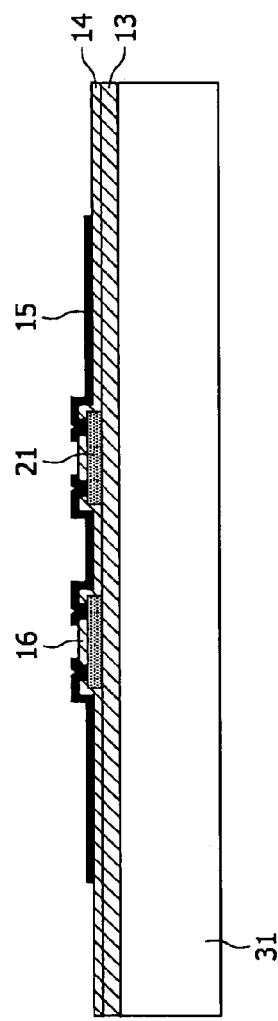

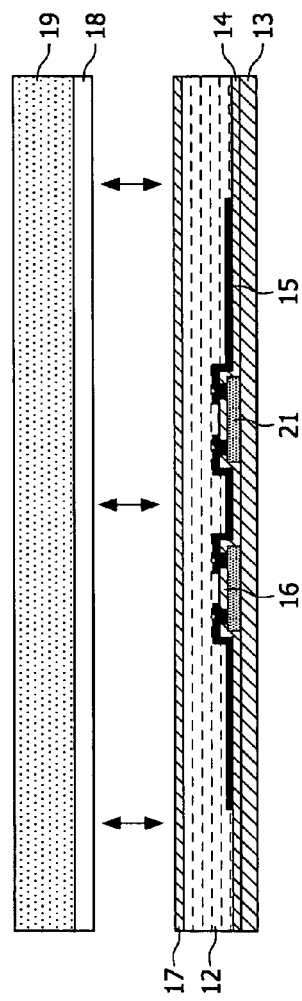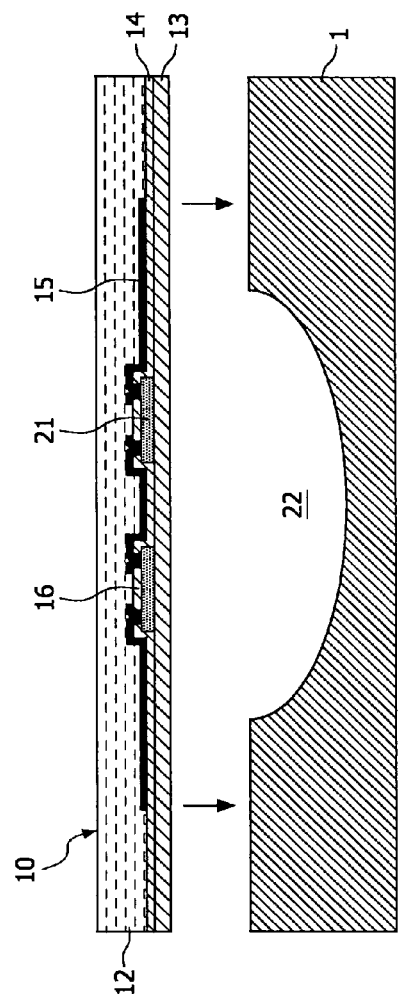

PRESSURE SENSOR, SENSOR PROBE COMPRISING A PRESSURE SENSOR, MEDICAL APPARATUS COMPRISING A SENSOR PROBE AND A METHOD OF FABRICATING A SENSOR PROBE

FIELD OF THE INVENTION

The invention relates to a pressure sensor. The invention also relates to a sensor probe comprising a pressure sensor, medical apparatus comprising a sensor probe and a method of fabricating a sensor probe.

BACKGROUND OF THE INVENTION

Pressure sensors comprising semiconductor integrated circuits are known in the art. U.S. Pat. No. 6,221,023 discloses a pressure sensor mounted on the distal end of an intra-corporeal catheter which detects pressure applied on the sensor. The sensor includes a chip that becomes deformed in accordance with pressure applied thereto and a piezoelectric element or strain gauge, mounted on the chip that issues detection signals in accordance with the chip's deformation. The pressure is detected based on the issued signals. The sensor also includes a pressure transmitting element mounted distal to the chip, in this case the distal end of a catheter. The sensor chip comprises a disk-like sensing plate on which the strain gauges are integrally formed. Wires are connected to the strain gauges for electrical connection to pads on a separate substrate that is attached to the side of a flexible base. The pressure transmitting element transmits pressure applied to the catheter's distal end to the sensing plate and tilts the sensing plate in accordance with the pressure. The strain gauges issue detection signals according to the degree and the direction of the tilting. A disadvantage of the known pressure sensor is that only pressure via direct mechanical contact to the distal end can be detected.

U.S. Pat. No. 7,207,227 discloses a pressure sensor for detecting pressure without requiring direct mechanical contact, wherein a cavity or recess is provided in a semiconductor substrate and a diaphragm or membrane, which can be deformed by pressure, covers the cavity. A disadvantage of the known semiconductor pressure sensor is that it requires a complex fabrication process to provide for the separate membrane within the integrated circuit.

SUMMARY OF THE INVENTION

It is an object of the invention to provide a semiconductor pressure sensor with a less complex fabrication process. The invention is defined by the independent claims. Advantageous embodiments are defined by the dependent claims.

This object is achieved by the pressure sensor according to the invention which comprises a flexible membrane deformable in response to a pressure, which covers a cavity and which comprises a strain gauge that produces signals corresponding to the deformation of the flexible membrane, wherein the flexible membrane is a flexible monolithic integrated circuit foil. In this way the invention provides for a flexible membrane that is both a semiconductor integrated circuit and a flexible foil, thereby avoiding the separate fabrication of a flexible membrane and thus resulting to a less complex fabrication process, because it does not include the process steps of fabricating a flexible membrane as part of the integrated circuit. The stress of the flexible foil obtained by the strain gauges gives information on the curvature and shape of the flexible foil. Furthermore, the invention allows for the application of a standard and simple IC (Integrated Circuit) mass production process, because the non-standard IC fabrication steps required for embedding the flexible membrane in the integrated circuit are not required anymore.

In an embodiment of the sensor according to the invention, the cavity is connected to a gas channel for applying a further pressure in the cavity in which a pressure control device controls the further pressure based on the signals from the strain gauge. By applying a further pressure via the gas channel, serving as an outlet or inlet, inside the cavity, which is sealed by the flexible foil, the further pressure may be such that it at least partly compensates for the pressure that is present outside the cavity, which is at the opposite side of the flexible foil. The deformation of the flexible foil resulting from the pressure outside the cavity is measured by the strain gauge and the signals produced by the strain gauge are used by the pressure control device to control the further pressure inside the cavity. In this way a pressure sensor is provided in which the deformation of the flexible integrated circuit foil is controlled by the pressure control device and the deformation of the flexible foil may be minimized in this way, thereby improving the lifetime of the flexible integrated circuit.

In an embodiment of the sensor according to the invention, the pressure sensor comprises at least four strain gauges in a Wheatstone bridge configuration. This increases the accuracy of the pressure detection because the influence of the variation of the environmental parameters is minimized, such as for example supply voltage and temperature variations. By proper placement of the strain gauges, the Wheatstone bridge is optimized for maximum responsivity.

In a further embodiment of the sensor according to the invention, the pressure sensor comprises a multiple of strain gauges distributed over the flexible foil. Because the strain gauges are distributed over the whole area of the flexible integrated circuit foil, the accuracy of the determination of the deformation of the flexible foil and, hence, of the pressure detection is increased, because the multiple of strain gauges give information of the deformation of the flexible foil on the positions on the flexible foil where the strain gauges are located. In this way the distribution of the detected pressure over the area of the flexible foil is measured. Furthermore, in this way an improved distinction between the location of tensile and compression stress on the flexible foil may be provided.

In another embodiment of the sensor according to the invention, the strain gauge comprises polysilicon which is integrated on the flexible foil. The standard IC manufacturing process step, comprising the formation of polysilicon elements, is in this way advantageously applied to integrate the strain gauge in the integrated circuit foil, which further simplifies the fabrication of the pressure sensor. Furthermore, it results in a further miniaturization of the integrated pressure sensor.

In an embodiment of the sensor according to the invention, the flexible foil comprises a parylene carrier. The ability to deposit parylene as a truly conformal, thin, continuous, uniform adherent coating permits its application as a protective coating. Another advantage is that, because parylene coated devices are stable, exhibit little or no change in response characteristics and are electrically and chemically isolated from the body, thin parylene films can be deposited on virtually any biomedical substrate, allowing the pressure sensor to be used in medical applications. Furthermore, parylene can be applied in a myriad of industrial, aerospace, chemical, automotive, consumer, pharmaceutical, and defense applications.

In an embodiment of the sensor according to the invention, the flexible foil further comprises a temperature sensor and/or a flow sensor. This advantageously increases the functionality of the pressure sensor. A measurement of the temperature and/or flow gives more information of the environment and hence results in a more accurate determination of the pressure by taking into account the influence of environmental parameters on the pressure.

In another embodiment of the sensor according to the invention, the flexible foil further comprises an antenna. This advantageously provides for a wireless operation mode of the sensor and/or for an efficient energy transfer to the flexible foil.

In another embodiment of the sensor according to the invention, the flexible foil further comprises signal processing circuitry. In this way a further miniaturization of the sensor probe is achieved by integration of additional functionality on the flexible foil. For example, the signal processing may comprise amplification, analog to digital conversion and/or data multiplexing.

The object is also achieved by a sensor probe for measuring a pressure inside a bodily lumen comprising a pressure sensor according to the invention. In this way, for example, the blood pressure inside a bodily lumen can be measured, for example by mounting the pressure sensor on the distal end of a catheter. Because of the miniaturization of the sensor and the sensor probe, the pressure inside the bodily lumen can be measured also in difficult to reach locations. For example, an improved assessment of the risk involved with an aneurysm can be made by the determination of the pressure and flow of the blood inside the aneurysm pouch.

The object is also achieved by a medical apparatus comprising the sensor probe according to the invention.

The object is also achieved by a method of fabricating a sensor probe comprising a pressure sensor, the method comprising the steps of:
  providing a sensor probe having a distal end that comprises a recess;
  mounting a flexible monolithic integrated circuit foil on the sensor probe thereby closing the recess and forming a cavity.

The method provides for a simple fabrication of a sensor probe with a pressure sensor, because by the single process step of mounting the flexible monolithic integrated circuit foil on the sensor probe both a flexible membrane and electronic circuitry, for example for measuring the deflection of the flexible membrane, are mounted on the sensor probe. The flexible integrated circuit foil, which is mounted on the catheter in a single process step, has more than one function: it serves as a flexible membrane which deflects in response to a pressure outside the cavity that is different than the pressure inside the cavity and, as it is also an integrated circuit comprising electronic circuitry, for example strain gauges for measuring the amount of deflection. Optionally, the integrated circuit may have other electronic circuits, sensors, and/or signal processing means.

In an embodiment of the method of fabricating a sensor probe with a pressure sensor according to the invention, the sensor probe is further provided with a gas channel for applying a further pressure in the cavity. By applying a further pressure via the gas channel, which serves as an inlet or outlet for applying the further pressure, inside the cavity, which is sealed by the flexible foil, the further pressure compensates for the pressure that is present outside the cavity, which is the environment near the distal end of the sensor probe. In this way the deformation of the flexible integrated circuit is controlled by the applied further pressure and may be, for example, minimized, thereby improving the lifetime of the flexible integrated circuit, and, hence, the sensor probe.

BRIEF DESCRIPTION OF THE DRAWINGS

These and other aspects of the invention will be further elucidated and described with reference to the drawings, in which:

FIGS. 4a-4g are schematic cross-sectional views illustrating a method of fabricating an embodiment of the pressure sensor according to the invention.

The Figures are not drawn to scale. In general, identical components are denoted by the same reference numerals in the Figures.

DETAILED DESCRIPTION OF EMBODIMENTS

Figure 1:
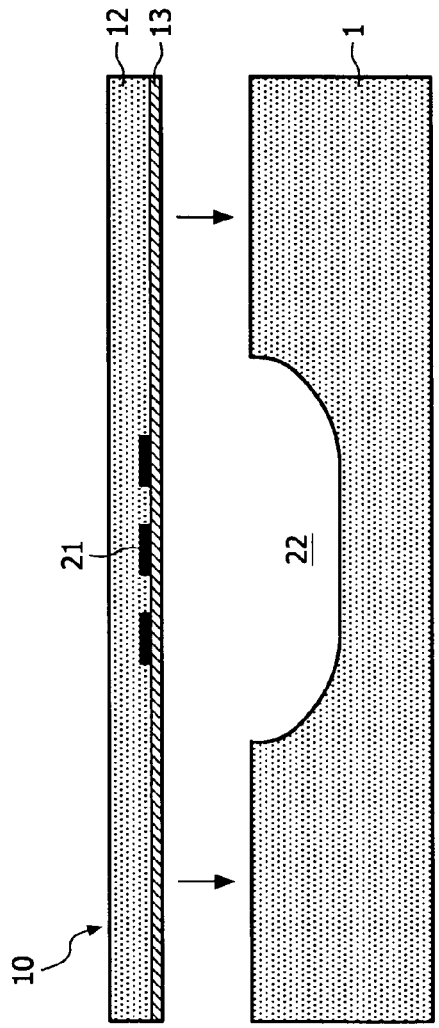
FIG. 1 is a schematic cross-sectional view of a pressure sensor according to an embodiment of the invention.

FIG. 1 shows a schematic cross-sectional view of an embodiment of a pressure sensor according to the invention. In this embodiment, a flexible monolithic integrated circuit foil 10 comprises strain gauges 21 that are protected by a protection layer 12, for example of polyimide and that are provided on a dielectric layer 13, which comprises for example silicon nitride. The strain gauges 21 measure the strain in the flexible integrated circuit foil 10. The invention is not restricted to the three strain gauges 21 as is illustrated in FIG. 1, but it is also possible to use only one strain gauge 21, whereas in another embodiment of the pressure sensor according to the invention a multiple of strain gauges 21 are distributed over the whole area of the flexible foil 10 which advantageously gives a more accurate measurement of the deflection of the flexible foil 10. The flexible foil 10 is mounted on a substrate 1 which has a recess 22. After mounting of the flexible foil 10 on the substrate 1, the recess 22 is covered and sealed by the flexible foil 10 and the recess 22 now forms a cavity 2. In the case that the pressure outside of the cavity 2 differs from the pressure inside the cavity 2, the flexible foil 10 will deform or deflect as a result of this pressure difference. The strain gauges 21 detect and measure the strain of the flexible foil 10 as a result of this pressure difference. Upon this deformation of the flexible foil 10 the strain gauges 21 produce a signal which is translated, for example by signal processing circuitry comprised in the flexible monolithic integrated circuit foil 10, into a quantities measure of the deformation of the flexible foil 10.

The flexible foil 10 is an integrated circuit and is, as a whole, deformable. The integrated circuit may comprise any electronic circuitry that can be fabricated with the well-known semiconductor IC (Integrated Circuit) technologies, which is not shown in FIG. 1. For example, Metal Oxide Semiconductor transistors, capacitors, resistors may be part of the integrated circuit, in combination forming electronic circuitry like an amplifier, a memory, a microprocessor, analog to digital conversion circuitry and/or data multiplexing circuitry. Furthermore, the electronic wiring, electrically connecting the strain gauges 21 and electronic circuitry, is fabricated using standard IC technologies and is integrated in the flexible foil 10. Additionally, the flexible foil 10 may be provided with a magnetic loop receiver antenna (not shown)

for enabling, for example, a wireless RF link. Furthermore, other sensors may be integrated on the flexible foil 10 for the measurement of other physical properties, such as, for example, a temperature sensor and/or a flow sensor. The flexible integrated circuit foil 10 is both an integrated circuit comprising a complexity of integrated electronic circuitry and a flexible membrane that is able to deflect or deform.

Figure 2:
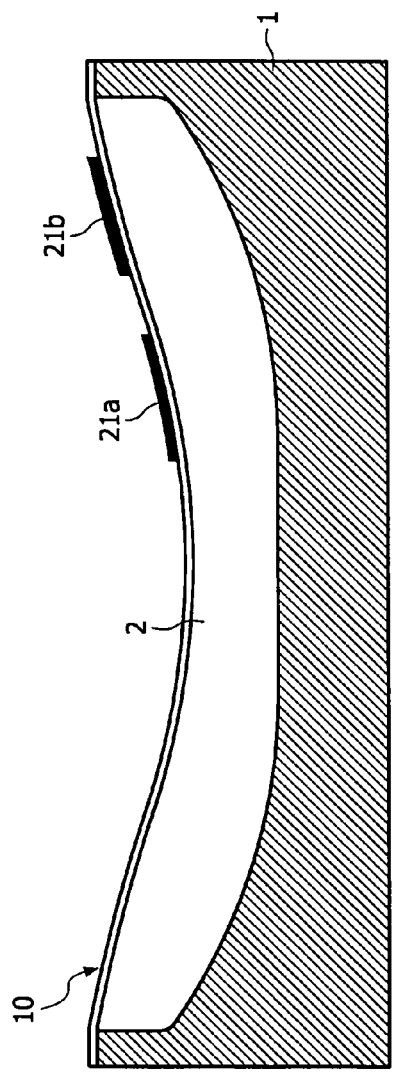
FIG. 2 is a schematic cross-sectional view of a pressure sensor according to an embodiment of the invention illustrating the deformation of the flexible foil.

FIG. 2 is a schematic cross-section of an embodiment of a pressure sensor according to the invention in which the deformation of the flexible foil 10 is illustrated. In this example, the pressure outside of the cavity 2 is higher than the pressure inside the cavity 2 and the flexible foil 10 is deflected into the cavity 2. The flexible foil 10 has regions where the flexible foil 10 is compressively stressed and regions where the flexible foil 10 is tensile stressed. By a proper placement and distribution of the individual strain gauges over the area of the flexible foil, the responsivity of the strain gauges 21 is optimized. In this example, strain gauge 21a experiences a compressive stress and strain gauge 21b a tensile stress. A further optimization of the responsivity is achieved by placing the strain gauges 21 in a Wheatstone bridge configuration (not shown), thereby minimizing the influence from, for example, temperature and supply voltage variations.

Figure 3:
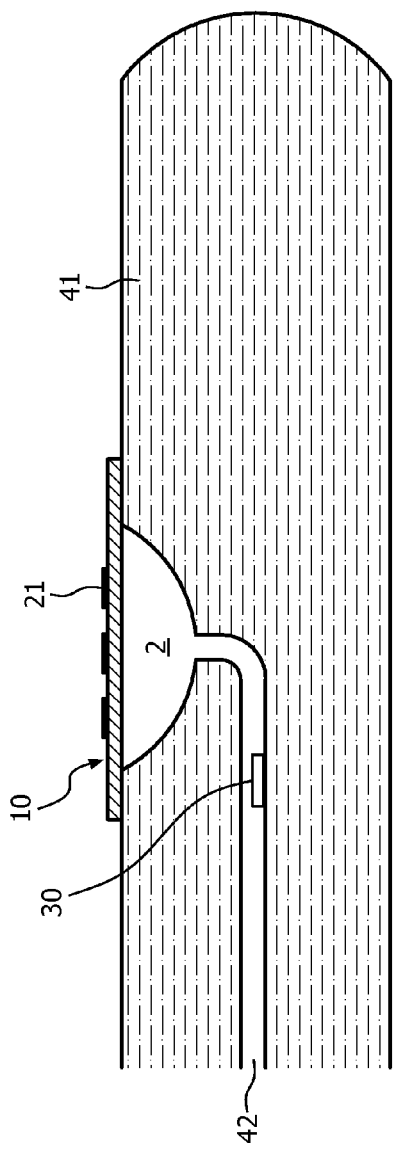
FIG. 3 is a schematic cross-sectional view of a distal end of a sensor probe comprising a pressure sensor according to an embodiment of the invention.

FIG. 3 shows a cross-section view of a distal end of a sensor probe 41 comprising a pressure sensor according to an embodiment of the invention. The sensor probe 41 is, for example, a catheter which, together with the pressure sensor according to the invention, enables the measurement of a blood pressure inside a bodily lumen. In this embodiment the cavity 2 is connected to a channel 42 which can be used as an inlet or outlet for regulating a pressure inside the cavity 2 of sensor probe 41. For example, the pressure inside the cavity 2 is set at a value such that it is substantially equal to the pressure outside the cavity 2, in this case the blood pressure inside the bodily lumen. In this situation the flexible foil 10 exhibits a minimum deformation, which prolongs the lifetime of the flexible foil 10. In another embodiment, the signals produced by the strain gauges 21 are used to regulate the pressure inside the cavity 2. For example, the signals of the strain gauges 21 are input to a pressure control device 30 which controls the pressure inside the cavity 2 based on the signals produced by the strain gauges 21. This feedback circuit, in this example, provides for a minimized deformation of the flexible foil 10. Furthermore, other sensors may be integrated on the flexible foil 10 for the measurement of other physical properties inside the bodily lumen. For example, combining the pressure sensor with a flow sensor enables an accurate characterization of aneurysm behavior. Examples of other sensors that may be integrated on the flexible foil 10, whether in combination with each other or not, are a sensor for measuring the absolute temperature and a sensor for measuring the oxygen level of the blood. Obviously in this case the flexible foil 10 needs to be sealed with a biocompatible coating. Parylene may be used for this purpose, which is a material that is widely accepted as a biocompatible coating in, for example, catheters and pacemakers. To prevent any problems in making electrical contacts to the flexible foil 10, the flexible foil 10 is preferably operated in a wireless mode. This eliminates the need for difficult and unreliable electrical contacts. In a convenient arrangement, the flexible foil 10 is on one side provided with a magnetic loop receiver antenna and a transmitter loop antenna. In this way the receiver and transmit antennas are situated in a very close proximity to each other, allowing for an efficient energy transfer and RF link. This RF link may also be used for bi-directional communication.

The flexible foil 10 is a monolithic integrated circuit foil wherein the flexible foil 10 is manufactured with an IC process and subsequently transferred to a flexible carrier of, for example, polyimide. U.S. Pat. No. 6,762,510 discloses a method of manufacturing such a flexible foil 10. The IC process can be advantageously used to integrate different devices and circuitry on the flexible foil 10. FIGS. 4a-4g illustrate a method of fabricating a pressure sensor according to an embodiment of the invention.

Figure 4C:
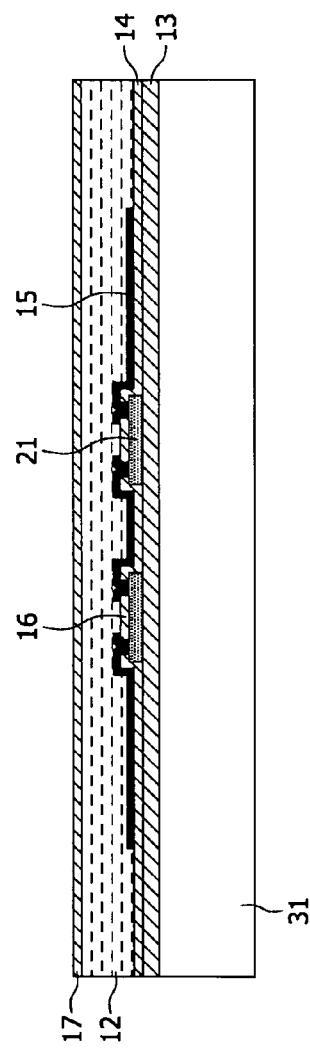
Figure 4D:
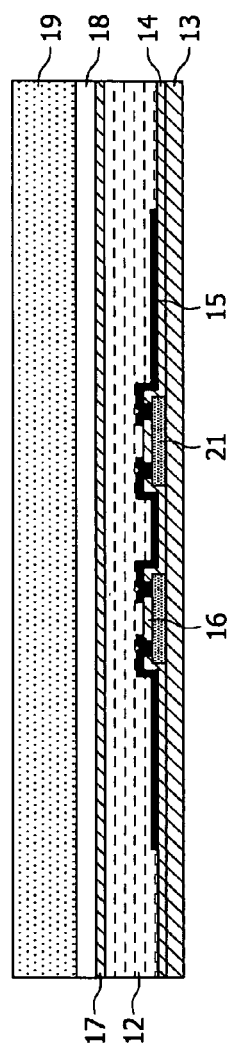
Figure 4G:
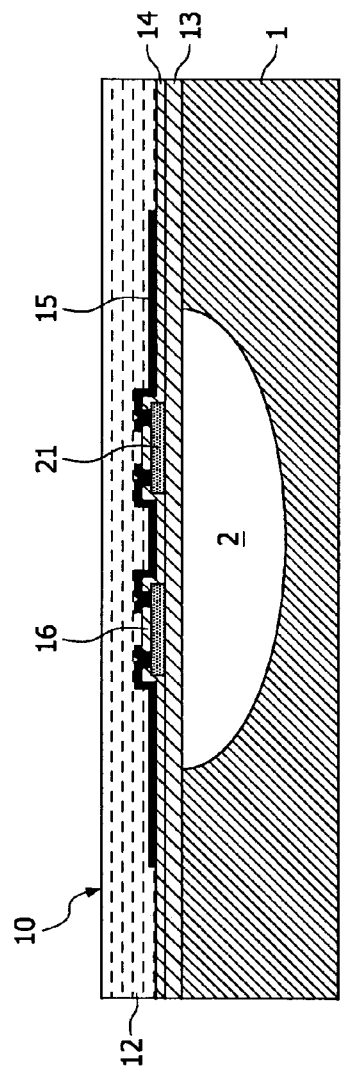

A silicon substrate 31 is provided with a top silicon nitride layer 13 with a thickness of, for example, 100 nm, as is shown in FIG. 4a. Subsequently polysilicon is deposited on the nitride layer 13, doped to achieve a specific resistivity and patterned using standard photolithographic techniques resulting in the polysilicon strain gauges 21, 16. Thereafter, as is illustrated in FIG. 4b, a dielectric layer 14 is deposited, for example LPCVD TEOS (Low Pressure Chemical Vapor Deposition Tetraethyl Orthosilicate) with a thickness of, for example, 200 nm. Contact holes are formed in the dielectric layer 14, using standard photolithographic techniques, and an interconnect layer 15 is formed using standard metallization and photolithographic techniques thereby forming an electrical connection to the polysilicon strain gauges 21 via the interconnect layer 15. Then, as is shown in FIG. 4c, a polyimide layer 12 with a thickness of 5-10 um is deposited followed by a curing step and a deposition of a separator layer 17, which comprises in this case a 0.5 um thick PECVD (Plasma Enhanced Chemical Vapor Deposition) silicon dioxide layer. The polyimide layer 12 serves as the flexible carrier for the integrated circuit. Thereafter a glass substrate 19 is attached to the separator layer 17 with an adhesive layer 18. The separator layer 17 is used to prevent mixing of the adhesive layer 18 and the polyimide substrate 19. Then the substrate 31 is removed with grinding and wet etching, as is shown in FIG. 4d, while the glass substrate 19 is serving as a temporary carrier for the remainder of the integrated circuit. Now the glass substrate 19 and the adhesive layer 18 are detached from the separator oxide layer 17, as is shown in FIG. 4e. Finally, the separator layer 17 is removed by standard etching techniques resulting in a flexible integrated circuit foil 10 that subsequently is mounted on the substrate 1 over the recess 22, as is shown in FIG. 4f. The result is shown in FIG. 4g in which the sealing of the recess 2 by the flexible foil 10 has formed the cavity 2.

Alternatively, instead of the polyimide layer 12, also parylene may be used as a flexible carrier, which is a biocompatible material.

In summary, the invention relates to a pressure sensor comprising a flexible membrane deformable in response to a pressure, which covers a cavity and which comprises a strain gauge that produces signals corresponding to the deformation of the flexible membrane, wherein the flexible membrane is a flexible monolithic integrated circuit foil.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:
1. A pressure sensor comprising:
a substrate having a cavity;

a flexible membrane deformable in response to a pressure, wherein the flexible membrane covers the cavity in the substrate; and a strain gauge that produces signals corresponding to deformation of the flexible membrane, wherein the flexible membrane is a flexible monolithic integrated circuit foil comprising the strain gauge, wherein the flexible monolithic integrated circuit foil further comprises signal processing circuitry, wherein the cavity is connected to a channel for acting as an inlet or an outlet for fluid entrance or exit from the cavity to regulate a pressure inside the cavity, and wherein a pressure control device controls the entrance or the exit of the fluid to control the pressure inside the cavity based on the signals from the strain gauge.

2. The pressure sensor as claimed in claim 1, wherein the pressure sensor comprises at least four strain gauges in a Wheatstone bridge configuration.

3. The pressure sensor as claimed in claim 1, wherein the pressure sensor comprises a plurality of strain gauges distributed over the flexible foil.

4. The pressure sensor as claimed in claim 1, wherein the strain gauge comprises polysilicon which is integrated on the flexible foil.

5. The pressure sensor as claimed in claim 1, wherein the flexible foil comprises a parylene carrier.

6. The pressure sensor as claimed in claim 1, wherein the flexible foil further comprises at least one of a temperature sensor and a flow sensor.

7. The pressure sensor as claimed in claim 1, wherein the flexible foil further comprises an antenna.

8. A sensor probe for measuring a pressure inside a bodily lumen comprising a pressure sensor, wherein the pressure sensor comprises:

a substrate having a cavity;

a flexible membrane deformable in response to a pressure, wherein the flexible membrane covers the cavity in the substrate; and a strain gauge that produces signals corresponding to deformation of the flexible membrane, wherein the flexible membrane is a flexible monolithic integrated circuit foil comprising the strain gauge, wherein the flexible monolithic integrated circuit foil further comprises signal processing circuitry, wherein the cavity is connected to a channel for acting as an inlet or an outlet for fluid entrance or exit from the cavity to regulate a pressure inside the cavity, and wherein a pressure control device controls the entrance or the exit of the fluid to control the pressure inside the cavity based on the signals from the strain gauge.

9. A method of fabricating a sensor probe comprising a pressure sensor, the method comprising the acts of:

providing a sensor probe having a distal end that comprises a recess in a substrate;

mounting a flexible monolithic integrated circuit foil on the sensor probe thereby closing the recess and forming a cavity;

providing a strain gauge that produces signals corresponding to deformation of the flexible monolithic integrated circuit foil; and providing signal processing circuitry in the flexible monolithic integrated circuit foil, wherein the flexible monolithic integrated circuit foil comprises the strain gauge and the signal processing circuitry, wherein the cavity is connected to a channel for acting as an inlet or an outlet for fluid entrance or exit from the cavity to regulate a pressure inside the cavity, and wherein a pressure control device controls the entrance or the exit of the fluid to control the pressure inside the cavity based on the signals from the strain gauge.

* * * * *